(12) United States Patent
Cha et al.

(10) Patent No.: US 10,670,664 B2
(45) Date of Patent: Jun. 2, 2020

(54) METHOD FOR DETERMINING RESISTANCE FACTOR OF SECONDARY BATTERY, AND APPARATUS AND METHOD FOR ESTIMATING CHARGE POWER USING DETERMINED RESISTANCE FACTOR

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 680 days.

(21) Appl. No.: 15/317,888

(22) PCT Filed: Feb. 2, 2016

(86) PCT No.: PCT/KR2016/001117
§ 371 (c)(1),
(2) Date: Dec. 9, 2016

(87) PCT Pub. No.: WO2016/126075
PCT Pub. Date: Aug. 11, 2016

(65) Prior Publication Data
US 2017/0123011 A1 May 4, 2017

(30) Foreign Application Priority Data

Feb. 2, 2015 (KR) .................. 10-2015-0016275
Feb. 1, 2016 (KR) .................. 10-2016-0012520

(51) Int. Cl.
*G01R 31/389* (2019.01)
*G01R 31/374* (2019.01)
(Continued)

(52) U.S. Cl.
CPC ........... *G01R 31/389* (2019.01); *G01R 27/02* (2013.01); *G01R 31/367* (2019.01);
(Continued)

(58) Field of Classification Search
CPC ................ G01R 1/389; G01R 31/3835; G01R 31/3842; G01R 31/367; G01R 31/3648;
(Continued)

(56) References Cited

U.S. PATENT DOCUMENTS 7,030,618 B2 * 4/2006 Nakamura ........ H01M 10/4242
324/430
7,446,504 B2 11/2008 Plett
(Continued)

FOREIGN PATENT DOCUMENTS

FR 2 968 769 A1 6/2012
JP 2011-530696 A 12/2011
(Continued)

OTHER PUBLICATIONS

"Partnership for a New Generation of Vehicles: PNGV Battery Test Manual", Idaho National Engineering and Environment Laboratory of the U.S. Department of Energy, Rev. 3, Feb. 2001, pp. 1-126.
(Continued)

*Primary Examiner* — Son T Le
*Assistant Examiner* — Dustin R Dickinson
(74) *Attorney, Agent, or Firm* — Birch, Stewart, Kolasch & Birch, LLP (57) ABSTRACT

A resistance factor determining method of a secondary battery according to the present disclosure determines, when the secondary battery has a certain temperature and state of charge, a primary differential value regarding a charge initial I-V profile calculated from a current value at a point of intersection at which a charge final I-V profile according to
(Continued)

changes in magnitude of the charging current meets a boundary line set to a charge upper limit as the resistance factor corresponding to the temperature and state of charge. Further, a charge power estimating apparatus and method according to the present disclosure estimates a charge power corresponding to the temperature and state of charge of the secondary battery while the secondary battery is being charged using the resistance factor pre-defined according to the state of charge and temperature of the secondary battery.

18 Claims, 6 Drawing Sheets

(51) Int. Cl.
  *G01R 31/36* (2020.01)
  *G08C 19/02* (2006.01)
  *G01R 27/02* (2006.01)
  *G01R 31/367* (2019.01)

(52) U.S. Cl.
  CPC ..... *G01R 31/3646* (2019.01); *G01R 31/3648* (2013.01); *G01R 31/374* (2019.01); *G08C 19/02* (2013.01)

(58) Field of Classification Search
  CPC .. G01R 31/3646; G01R 31/374; G01R 27/02; H02J 7/045; H02J 7/0052; G08C 19/02; H01M 10/48; H01M 10/446; H01M 10/44
  See application file for complete search history.

(56) References Cited

U.S. PATENT DOCUMENTS

| | | | |
|---|---|---|---|
| 7,548,821 | B2 | 6/2009 | Tae et al. |
| 7,589,532 | B2 | 9/2009 | Plett |
| 8,332,169 | B2 | 12/2012 | Kang et al. |
| 8,937,459 | B2 | 1/2015 | Park et al. |
| 2007/0145953 | A1 | 6/2007 | Asai et al. |
| 2010/0079111 | A1* | 4/2010 | Masuda .............. H01M 10/486 320/134 |
| 2012/0235630 | A1* | 9/2012 | Qiu ........................ H02J 7/022 320/107 |
| 2013/0116954 | A1 | 5/2013 | Tazoe et al. |
| 2014/0095088 | A1 | 4/2014 | Kwok et al. |
| 2015/0084639 | A1 | 3/2015 | Joe |

FOREIGN PATENT DOCUMENTS

| | | |
|---|---|---|
| JP | 2014-25738 A | 2/2014 |
| KR | 10-0814883 B1 | 3/2008 |
| KR | 10-1160545 B1 | 6/2012 |
| KR | 10-2012-0120889 A | 11/2012 |
| KR | 10-2013-0061719 A | 6/2013 |
| KR | 10-1367161 B1 | 2/2014 |
| KR | 10-2014-0071929 A | 6/2014 |

OTHER PUBLICATIONS

International Search Report issued in PCT/KR2016/001117, dated May 26, 2016.

* cited by examiner

METHOD FOR DETERMINING RESISTANCE FACTOR OF SECONDARY BATTERY, AND APPARATUS AND METHOD FOR ESTIMATING CHARGE POWER USING DETERMINED RESISTANCE FACTOR

TECHNICAL FIELD

The present application claims priority to Korean Patent Applications No. 10-2015-0016275 and No. 10-2016-0012520 filed on Feb. 2, 2015 and Feb. 1, 2016, respectively, in the Republic of Korea, the disclosures of which are incorporated herein by reference.

The present disclosure relates to an apparatus and a method for determining a resistance factor of a secondary battery and for estimating a charge power using the resistance factor.

BACKGROUND ART

An application of a high-performance secondary battery requires estimating a charge power corresponding to a state of charge (SOC) of the secondary battery.

For example, in a hybrid electric vehicle (HEV) and an electric vehicle (EV), a vehicle controller continuously demands the latest information on a charge power of a secondary battery from a battery management system (BMS).

The Hybrid Pulse Power Characterization (HPPC) is the power calculation technology for secondary batteries, widely known in the art.

HPPC can be found in the Partnership for New Generation Vehicles (PNGV) Battery Test Manual (Rev. 3, February 2001) published by the Idaho National Engineering and Environment Laboratory of the U.S. Department of Energy.

HPPC estimates power of a secondary battery considering only operation design limits, $V_{min}$, $V_{max}$, regarding a voltage of the secondary battery. Accordingly, this method does not consider the design limits associated with the state of charge (z) and currents of the secondary battery.

A "state of charge" as used herein refers to a relative ratio of currently remaining capacity relative to the capacity of a fully-charged secondary battery. A "state of charge" is represented by parameters, SOC or z. Parameter, SOC, is used to represent a state of charge in percentages. Further, parameter, z, is used to represent a state of charge in numbers between 0 and 1.

HPPC models the voltage of a secondary battery simply by Equation 1 below.

$$V=OCV(z)+R\times I \qquad \text{<Equation 1>}$$

Here, OCV(z) is the open circuit voltage (OCV) of the secondary battery, which corresponds to the state of charge of the secondary battery, and R is a constant that represents the resistance of the secondary battery.

OCV(z) may be determined by an SOC-OCV look-up table pre-defined through tests. That is, an OCV(z) value may be obtained by mapping the open circuit voltage corresponding to the state of charge in the look-up table.

Figure 1:
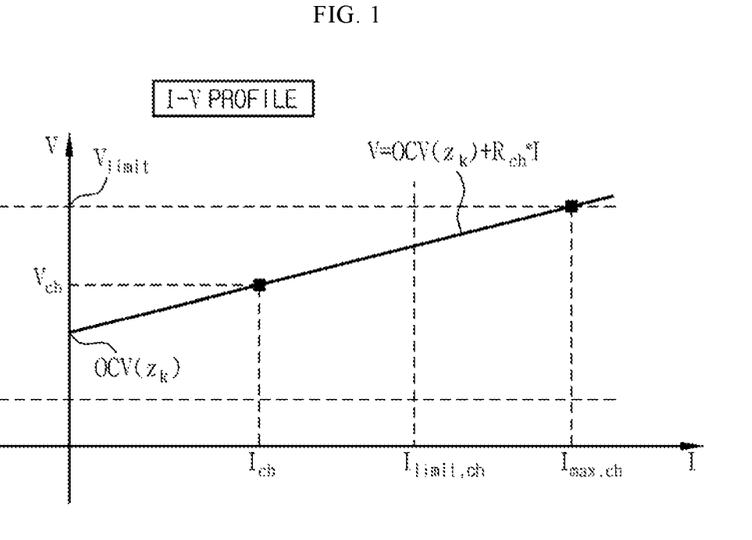
FIG. 1 exemplifies an I-V profile to explain a problem occurring when no charging current upper limit is set when determining the charge power of a secondary battery using the Hybrid Pulse Power Characterization (HPPC).

FIG. 1 illustrates in detail the concept of determining charge power of a secondary battery using HPPC.

As illustrated in FIG. 1, the final voltage of a secondary battery, $V_{ch}$, is measured as soon as the secondary battery with a state of charge, $Z_k$, is charged with a constant current having the magnitude of $I_{ch}$ for a certain period of time (for example: 10 seconds). Here, the final voltage of a secondary battery, $V_{ch}$, may vary depending on the magnitude of the charging current and charging time.

Next, the slope of I-V profile, $R_{ch}$, is determined based on Equation 1, and by using $R_{ch}$, the linear equation, $V=OCV(z_k)+R_{ch}*I$, regarding the I-V profile is determined. Next, extrapolation is applied to the determined equation to determine the current value corresponding to $V_{limit}$, the charge upper limit voltage. In this manner, the maximum charging current, $I_{max,ch}$, is determined.

According to HPPC, when the maximum charging current, $I_{max,ch}$, is determined, the charge power, $P^c$, is determined by Equation 2 below.

$$P^c=V_{limit}\times I_{max,ch}=V_{limit}\times[(V_{limit}-OCV(z_k))\div R_{ch}] \qquad \text{<Equation 2>}$$

However, HPPC does not set the operation design limits for the charging current. If the maximum charging current, $I_{max,ch}$, of the secondary battery determined by HPPC is greater than the charge upper limit current that can be actually output by the secondary battery, the charge power is determined to be greater than the performance of the secondary battery. In this case, the secondary battery may be charged under a condition that is excessive than it should be. Especially, in the case of a lithium secondary battery, overcharging may be a cause of battery explosion.

Accordingly, there is demand for a new charge power estimation technology in the related field, which can overcome the shortcomings of HPPC mentioned above.

DISCLOSURE

Technical Problem

The present disclosure is designed to solve the problems of the related art, and therefore the present disclosure is directed to providing a method for experimentally determining a resistance factor of a secondary battery that may be used in a new charge power estimating method and configuring a resistance factor look-up table using the same.

The present disclosure is also directed to providing an apparatus and method for estimating a charge power of a secondary battery within charge upper limits with a safety margin using the resistance factor look-up table.

Technical Solution

In one aspect of the present disclosure, there is provided a resistance factor determining method of a secondary battery, the method including the steps of: (a) measuring a plurality of charge initial voltage data and a plurality of charge final voltage data according to changes in magnitude of a charging current per temperature and state of charge of the secondary battery, and storing the same in a memory; (b) determining a charge final I-V profile from the plurality of charge final voltage data, and determining a point of intersection at which the charge final I-V profile meets a boundary line corresponding to a charge upper limit current or a charge upper limit voltage pre-set as a charge upper limit condition; (c) determining a charge initial I-V profile from the plurality of charge initial voltage data, and determining a primary differential value regarding the charge initial I-V profile based on a current value of the point of intersection; and (d) determining the determined primary differential value as a resistance factor corresponding to a temperature and state of charge of the secondary battery.

Preferably, the resistance factor determining method according to the present disclosure may further include defining a resistance factor look-up table in the memory such that a resistance factor of the secondary battery may be mapped by the temperature and state of charge of the secondary battery; and storing the determined resistance factor in the defined resistance factor look-up table.

According to one aspect, the charge initial voltage data may be voltage data measured at a time point within 1 second after the charging current was applied to the secondary battery, and the charge final voltage data may be voltage data measured at a time point when applying of the charging current to the secondary battery ended.

According to another aspect, the step (a) may include maintaining the temperature of the secondary battery constant; proceeding a charge test of applying a plurality of charging currents having different magnitudes to the secondary battery per state of charge of the secondary battery; and measuring and storing the charge initial voltage and the charge final voltage of the secondary battery every time each charging current is applied.

Preferably, the charge test may be paused when a magnitude of the charging current applied to the secondary battery is greater than the charge upper limit current or when a latest measured charge final voltage of the secondary battery is greater than the charge upper limit voltage.

In another aspect of the present disclosure, there is provided a charge power estimating apparatus of a secondary battery, the apparatus including a storage unit where a resistance factor look-up table for referencing a resistance factor pre-determined per temperature and state of charge of the secondary battery is pre-stored; a sensor unit that measures a charging current and temperature of the secondary battery while the secondary battery is being charged; and a control unit that determines the state of charge of the secondary battery, determines the resistance factor corresponding to the determined state of charge and the measured temperature with reference to the resistance factor look-up table, and estimates the charge power of the secondary battery from the determined resistance factor and the measured charging current.

Preferably, when the secondary battery has a certain temperature and state of charge, the resistance factor may be a primary differential value regarding a charge initial I-V profile calculated from a current value at a point of intersection at which a charge final I-V profile according to changes in magnitude of the charging current meets a boundary line set to a charge upper limit.

Preferably, the boundary line may be a boundary line that indicates a charge upper limit current and a charge upper limit voltage.

According to one aspect, the charge initial I-V profile may be a graph that defines a correlation between the charging current applied to the secondary battery and a voltage measured right after the corresponding charging current was applied when a plurality of charging currents having different magnitudes are applied to the secondary battery.

Preferably, a plurality of voltage data constructing the charge initial I-V profile may be voltage data measured within 1 second after each charging current was applied to the secondary battery.

According to another aspect, the charge final I-V profile may be a graph that defines a correlation between the charging current applied to the secondary battery and a voltage measured at a time point when the applying of the corresponding charging current ended when a plurality of charging currents having different magnitudes are applied to the secondary battery.

Preferably, the control unit may be configured to store the estimated charge power in the storage unit.

Optionally, the control unit may be connected with the display unit, and may display the estimated charge power through the display unit.

Optionally, the control unit may be connected with the communication interface, and may externally transmit the estimated charge power through the communication interface.

In another aspect of the present disclosure, there is provided a charge power estimating method of a secondary battery, the method including providing a resistance factor look-up table for referencing a resistance factor pre-determined per temperature and state of charge of the secondary battery; measuring a charging current and the temperature of the secondary battery while the secondary battery is being charged; determining the state of charge of the secondary battery; determining the resistance factor corresponding to the determined state of charge and the measured temperature with reference to the resistance factor look-up table; and estimating a charge power of the secondary battery from the determined resistance factor and the measured charging current.

Preferably, when the secondary battery has a certain temperature and state of charge, the resistance factor may be a primary differential value regarding a charge initial I-V profile calculated from a current value at a point of intersection at which a charge final I-V profile according to changes in magnitude of the charging current meets a boundary line set to a charge upper limit.

A charge power estimating method of a secondary battery according to the present disclosure may further include storing, displaying or transmitting the estimated charge power.

Advantageous Effects

According to an aspect of the present disclosure, a resistance factor to be utilized in estimating a charge power of a secondary battery within a safety margin can be easily determined.

According to another aspect of the present disclosure, a charge power of a 10 secondary battery can be estimated reliably with a safety margin from charge upper limit conditions of the secondary battery.

According to another aspect of the present disclosure, the voltage or charging current of a secondary battery can be prevented from increasing excessively in the process of controlling the charge of the secondary battery.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

In the description provided below, the secondary battery refers to the lithium secondary battery. The "lithium secondary battery" as used herein encompasses a secondary battery in which lithium ions act as the operating ions and thereby inducing electrochemical reaction in the positive electrode and the negative electrode during charging and discharging.

Meanwhile, while the name of the secondary battery may vary according to types of electrolyte or separator used in the lithium secondary battery, types of packaging materials used for packing the secondary battery, inner or outer structure of the lithium secondary battery, and so on, the secondary battery is to be interpreted as falling under the scope of the lithium secondary battery described above as long as lithium ions are used for operating ions in such secondary battery.

The present disclosure is applicable to other secondary batteries as well as the lithium secondary battery. Accordingly, irrespective of the type of the secondary battery, even the secondary battery having operating ions other than lithium ions is to be interpreted as falling under the scope of the present disclosure as long as such secondary battery can apply the technical concept of the present disclosure.

Further, the secondary battery is not limited by the number of elements constructing the same. Accordingly, the secondary battery should be interpreted as encompassing not only a single cell including an assembly of positive electrode/separator/negative electrode and electrolyte in a single package, but also an assembly of single cells, a module in which a number of assemblies are connected in series and/or in parallel, a pack in which a number of modules are connected in series and/or in parallel, a battery system in which a number of packs are connected in series and/or in parallel, and so on.

The first embodiment to be explained hereinafter relates to a method for determining a resistance factor being used in estimating a charge power of the secondary battery.

Figure 2:
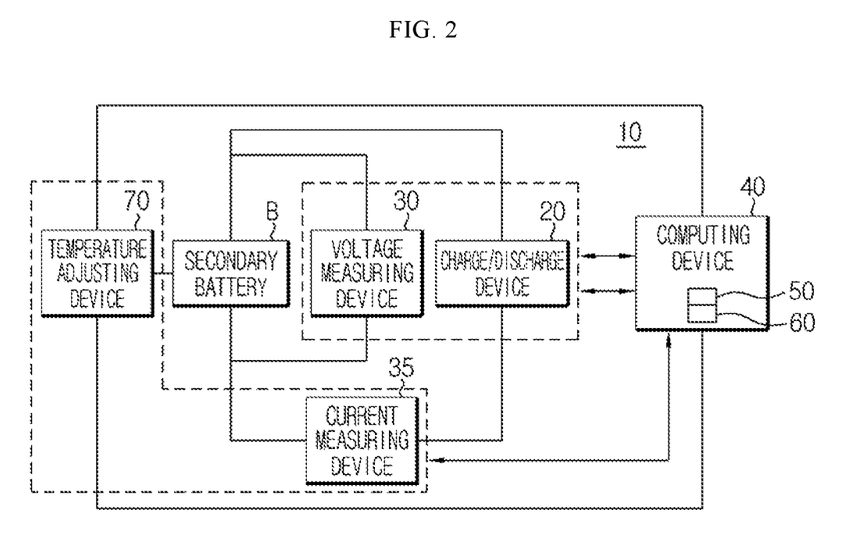
FIG. 2 schematically illustrates the configuration of a resistance factor determining system according to an embodiment of the present disclosure.

In order to determine the resistance factor being used in estimating the charge power of the secondary battery, a resistance factor determining system 10 as illustrated in FIG. 2 may be provided.

The resistance factor determining system 10 according to an embodiment of the present disclosure includes a charge/discharge device 20 capable of charging the secondary battery B with an arbitrary charging current for a certain period of time, or of adjusting the state of charge of the secondary battery B to a wanted value.

Preferably, the charge/discharge device 20 charges or discharges the secondary battery B with a constant current of various magnitudes for the certain period of time.

The charge/discharge device 20 includes a charge unit capable of charging the secondary battery B, and a discharge unit capable of discharging the secondary battery B.

The charge unit may include a charge circuit well-known in the art. Similarly, the discharge unit may include a discharge circuit well-known in the art.

The resistance factor determining system 10 also includes a voltage measuring device 30 capable of measuring a charge initial voltage right after the secondary battery B started being charged and a charge final voltage when a pre-set charging time ended, while the secondary battery B is being charged by the charge/discharge device 20 for the certain period of time.

In an embodiment, when the secondary battery B is being charged for 10 seconds, the charge initial voltage is the voltage measured within 1 second since the charging current started to flow, for example, after 0.1 second passed, and the charge final voltage is the voltage measured after the charging current started to flow, for example, after 10 seconds.

Since the charge initial voltage and the charge final voltage refer to the voltage measured at an early stage of charging and the voltage measured at a later stage of charging, respectively, the time point for measuring the charge initial voltage and the charge final voltage are not limited to the aforementioned, but may vary.

Preferably, the voltage measuring device 30 may include a voltmeter or a voltage measuring circuit well-known in the art.

The resistance factor determining system 10 also further includes a current measuring device 35 capable of measuring the current of the secondary battery B while the secondary battery B is being charged or discharged by the charge/discharge device 20 for the certain period of time.

In an embodiment, the current measuring device 35 may measure the current of the secondary battery B at time intervals while the secondary battery B is being charged or discharged, and provide the current values measured to a computing device 40 that will be explained hereinafter.

Preferably, the current measuring device 35 may include a current meter or a current measuring circuit well-known in the art.

Preferably, the resistance factor determining system 10 further includes the computing device 40. The computing device 40 may be connected to the charge/discharge device 20, the voltage measuring device 30 and the current measuring device 35, and may control each of the aforementioned devices according to an embodiment of the present disclosure.

The computing device 40 may set a plurality of magnitudes of charging currents, charging period of time, and the like to be applied when charging the secondary battery B at a system operator's request. For this purpose, the computing device 40 may provide the system operator with a graphic user interface through which various setting values may be input.

The computing device 40 may also receive input of the charge initial voltage and the charge final voltage from the voltage measuring device 30 while the secondary battery B is being charged.

The computing device 40 may also receive input of the measured current value of the secondary battery B at time intervals while the secondary battery B is being charged or discharged, from the current measuring device 35.

Preferably, the computing device 40 may include a resistance factor determining program 60 capable of determining the resistance factor of the secondary battery B in an automated manner, and a memory 50 capable of storing a program code including a control logic of the resistance factor determining program 60, data being generated in the process of the control logic being executed, and pre-defined data to be referenced when estimating the resistance factor.

Preferably, the computing device 40 may include a microprocessor that executes the pre-defined control logics of the resistance factor determining program 60.

It should be noted that the functions explained hereinafter as being performed by the resistance factor determining program 60 will be performed by the microprocessor in a hardware point of view.

Figure 3:
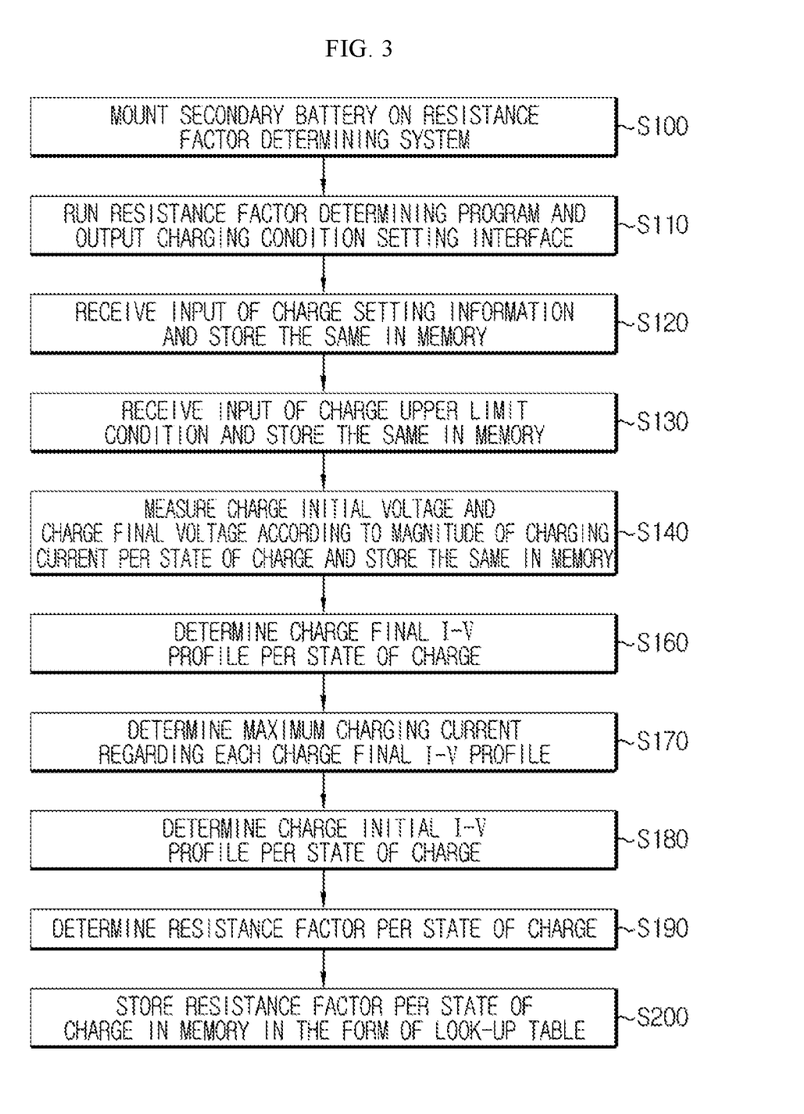
FIG. 3 is a flowchart illustrating a resistance factor determining method using the resistance factor determining system of FIG. 2.

FIG. 3 is a flowchart sequentially illustrating the method for determining the resistance factor being used in estimating the charge power of the secondary battery B using the resistance factor determining system 10 disclosed in FIG. 2.

Referring to FIG. 3, first of all, by the system operator, the secondary battery B of which the resistance factor is to be determined is mounted onto the resistance factor determining system 10 (S100), and the resistance factor determining program 60 is run in the computing device 40 (S110).

Here, the secondary battery B is preferably a battery at a beginning of life (BOL) state.

When the resistance factor determining program 60 is finished running, a charging condition setting interface provided with a graphic user interface (GUI) through which the charging condition may be input is visually output to the system operator through a monitor of the computing device 40 (S110).

For example, by using the charging condition setting interface, the system operator may set a state of charge section (0 to 100%) over which the charge tests will be proceeded and an interval (5%) of a state of charge at which the charge tests will be executed, the plurality of magnitudes of charging currents 50 A, 100 A, 150 A, 200 A, 225 A, 275 A and the like that will be applied to the secondary battery, the time (10 seconds) when the charging current will be applied to the secondary battery B, and timing information (0.1 second and 10 seconds) regarding when the charge initial voltage and the charge final voltage will be measured, etc.

Next, the resistance factor determining program 60 receives input of the charge setting information from the system operator through the charging condition setting interface and stores the same in the memory 50 (S120).

Next, the resistance factor determining program 60 displays on the monitor of the computing device 40 the charge upper limit setting interface that includes a graphic user interface (GUI) for inputting charge upper limit conditions including the charge upper limit current, $I_{limit,ch}$, and the charge upper limit voltage, $V_{limit,ch}$, and receives input of the charge upper limit conditions from the system operator and stores the same in the memory 50 (S130).

For example, by using the charge upper limit setting interface, the system operator may set the charge upper limit current, $I_{limit,ch}$, to 240 A, and set the charge upper limit voltage, $V_{limit,ch}$, to 4.16V.

Next, the resistance factor determining program 60 measures the charge initial voltage and the charge final voltage as the charge response characteristics with respect to the plurality of charging currents having different magnitudes per state of charge of the secondary battery B by controlling the charge/discharge device 20 and the voltage measuring device 30 with reference to the charge setting information stored in the memory 50, and receives input of the measured charge initial voltage and charge final voltage from the voltage measuring device 30 and stores the same in the memory 50 (S140).

Figure 4:
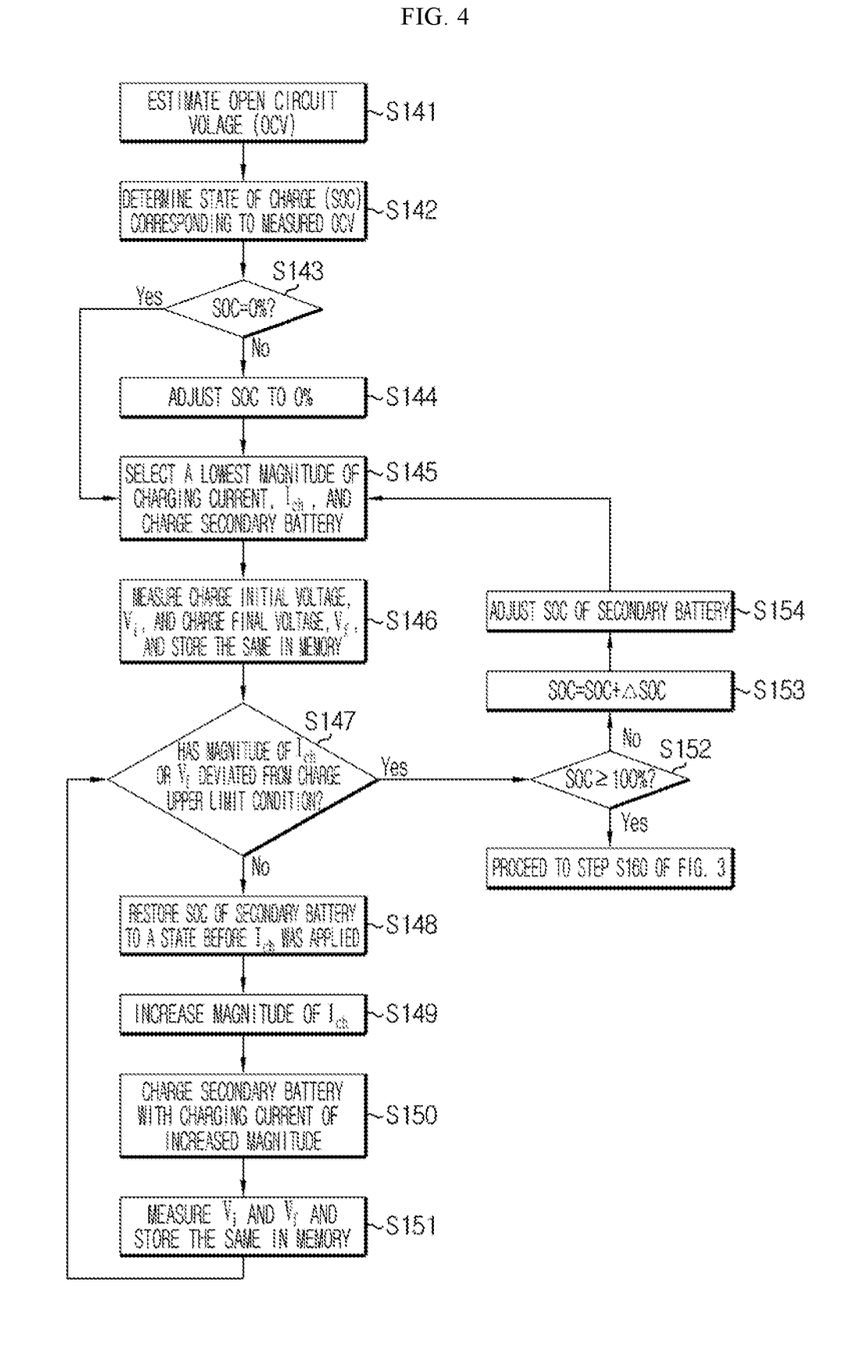
FIG. 4 is a flowchart illustrating in detail at step S140 of the flowchart of FIG. 3.

FIG. 4 is a flowchart illustrating in detail the process in which the charge initial voltage and the charge final voltage are measured under the condition of the plurality of charging currents per state of charge of the secondary battery according to an embodiment of the present disclosure.

In FIG. 4, $I_{ch}$, represents the charging current applied to the secondary battery B, $V_i$ and $V_f$ respectively represent the charge initial voltage and the charge final voltage measured while the secondary battery B is being charged.

Referring to FIG. 4, first of all, the resistance factor determining program 60 controls the voltage measuring device 30 and a temperature adjusting device 70 so as to measure the open circuit voltage and the temperature of the secondary battery B (S141), and determines the state of charge corresponding to the open circuit voltage and the temperature measured with reference to the OCV-SOC look-up table pre-stored in the memory 50 (S142).

For reference, the OCV-SOC look-up table includes the state of charge information corresponding to the open circuit voltage and the temperature of the secondary battery B Next, the resistance factor determining program 60 determines whether or not the state of charge determined at step S142 is an initial value (S143). For example, the initial value may be 0%.

If the state of charge is not the initial value, the resistance factor determining program 60 uses an ampere counting method to determine discharging conditions including the magnitude of the discharging current and the discharging time necessary for adjusting the state of charge of the secondary battery B to the initial value, and discharges the secondary battery B according to the determined discharging condition by controlling the charge/discharge device 20 (S144), and proceeds to step S145.

Here, supposing the capacity of the secondary battery B that must be discharged to adjust the state of charge of the secondary battery B to the initial value is Q(Ah), by primarily determining the magnitude of the discharging current and then dividing the Q value by the magnitude value of the current, the discharging time may be determined. The magnitude of the discharging current may be set in advance.

On the other hand, if the state of charge of the secondary battery B corresponds to the initial value, the resistance factor determining program 60 proceeds directly to step S145.

Next, the resistance factor determining program 60 controls the charge/discharge device 20 to apply to the secondary battery B the charging current, $I_{ch}$, of a smallest magnitude, of the pre-set magnitudes of the charging currents, thereby charging the secondary battery B (S145).

Further, the resistance factor determining program 60 controls the voltage measuring device 30 while the secondary battery B is being charged, to measure the charge initial voltage, $V_i$, and charge final voltage, $V_f$, at the pre-set timing, and to receive input of the measured initial voltage, $V_i$, and charge final voltage, $V_f$, from the voltage measuring device 30 to store the same in the memory 50 (S146).

Specifically for example, the resistance factor determining program 60 may control the voltage measuring device 30 such that the charge initial voltage, $V_i$, and the charge final voltage, $V_f$, of the secondary battery B may be measured at the timing of 0.1 seconds and 10 seconds, in the case where the secondary battery B is charged for 10 seconds.

Next, the resistance factor determining program 60 determines whether or not the magnitude of the charging current, $I_{ch}$, applied as the charging condition of the secondary battery B or the charge final voltage, $V_f$, measured at step S146 has deviated from the pre-set charge upper limit condition (S147).

Here, if the magnitude of the charging current, $I_{ch}$, is greater than the charge upper limit current as set, $I_{limit,ch}$, or if the magnitude of the measured charge final voltage, $V_f$, is greater than the charge upper limit voltage as set, $V_{limit,ch}$, it means that the magnitude of the charging current, $I_{ch}$, or the charge final voltage, $V_f$, has deviated from the charge upper limit condition.

If it is determined NO at step S147, the resistance factor determining program 60 controls the charge/discharge device 20 to discharge the secondary battery B, thereby restoring the state of charge of the secondary battery B to the state before the charging current was applied (S148).

Here, the magnitude of the discharging current and the discharging time may be adjusted to be substantially the same as the magnitude of the charging current and the charging time applied when charging the secondary battery B.

Next, the resistance factor determining program 60 may increase the magnitude of the charging current, $I_{ch}$, to be applied to the secondary battery B to the magnitude that is the least greater than previous one with reference to the charge setting information stored in the memory 50 (S149), control the charge/discharge device 20 to charge the secondary battery B with the charging current, $I_{ch}$, that is greater than previous one (S150), and control the voltage measuring device 30 to measure the charge initial voltage, $V_i$, and the charge final voltage, $V_f$, while the charging is proceeding and store the same in the memory 60 (S151).

Here, the timing at which the charge initial voltage, $V_i$, and the charge final voltage, $V_f$, is measured is substantially the same as the timing applied at step S146.

When S151 ends, the resistance factor determining program 60 proceeds to step S147.

Therefore, the resistance factor determining program 60 repeats the steps from step S148 to step S151 until the magnitude of charging current, $I_{ch}$, applied to the secondary battery B or the magnitude of the charge final voltage, $V_f$, measured as the charge response characteristics deviates from the charge upper limit condition while increasing the magnitude of the charging current, $I_{ch}$, to be applied to the secondary battery B according to the pre-set condition.

Meanwhile, if it is determined YES at step S147, the resistance factor determining program 60 ends the charge test when the state of charge of the secondary battery B is at an initial value, and proceeds to step S152.

At step S152, the resistance factor determining program 60 determines whether or not the magnitude of a current state of charge of the secondary battery B is or above 100%, that is the set upper limit, prior to proceeding the charge test at a state where the state of charge of the secondary battery B has been increased by a pre-set width.

If it is determined YES at step S152, the resistance factor determining program 60 ends the charge test regarding the secondary battery B, and proceeds to step S160 of FIG. 3.

On the other hand, if it is determined NO at step S152, the resistance factor determining program 60 increases the state of charge of the secondary battery B by the pre-set width, $\Delta SOC$, with reference to the charge setting information stored in the memory 50 (S153), and controls the charge/discharge 20 to charge the secondary battery B, thereby adjusting the state of charge of the secondary battery B to the state of charge determined at step S153 (S154). The magnitude of the charging current to be applied to the secondary battery B and the charging time at step S154 may be determined by the Ampere counting method using the SOC value determined at step S153.

Here, supposing the capacity of the secondary battery B that must be charged to adjust the state of charge of the secondary battery B to the SOC value determined at step S153 is Q'(Ah), by primarily determining the magnitude of the charging current and then dividing the Q' value by the magnitude value of the current, charging time may be determined. The magnitude of the charging current may be pre-set.

Next, the resistance factor determining program 60 proceeds to step S145, and thus repeats the aforementioned process of measuring the charge initial voltage, $V_i$, and the charge final voltage, $V_f$, and storing the same to the memory 50 while increasing the magnitude of the charging current, $I_{ch}$, to be applied to the secondary battery B according to the pre-set condition until the magnitude of the charging current, $I_{ch}$, or the charge final voltage, $V_f$, regarding the state of charge of the secondary battery B adjusted at step S153 deviates from the pre-set charge upper limit condition.

The resistance factor determining program 60 may repeat the steps from step S145 to step S151 until the state of charge of the secondary battery B becomes 100%, and when the state of charge of the secondary battery B becomes or above 100%, the resistance factor determining program 60 may end the charge test proceeded per state of charge of the secondary battery B and proceed to step S160 of FIG. 3.

Hereinafter, for convenience of explanation, the charge initial voltage, $V_i$, and the charge final voltage, $V_f$, measured and stored in the memory 50 when the state of charge of the secondary battery B is SOC, and the magnitude of the charging current is $I_{ch}(k)$, that is a $k^{th}$ magnitude of m pre-set magnitudes of the charging current will be indicated as below.

Charge initial voltage: $V_{i,@SOCp}(I_{ch(k)})[k=1, \ldots, m]$
Charge final voltage: $V_{f,@SOCp}(I_{ch(k)})[k=1, \ldots, m]$ Further, when the magnitude of the charging current, $I_{ch}$, applied to the secondary battery B and the voltage of the secondary battery B are defined as X coordinate and Y coordinate, respectively, the charge initial voltage data and the charge final voltage data may be defined as a plurality of coordinate data as shown below.

Charge initial voltage data: $(I_{ch(k)}, V_{i,@SOCp}(I_{ch(k)}))$ [k=1, ..., m]

Charge final voltage data: $(I_{ch(k)}, V_{f,@SOCp}(I_{ch(k)}))$ [k=1, ..., m]

Further, the I-V profile being plotted by the plurality of charge initial voltage data and by the plurality of charge final voltage data may be defined as the charge initial I-V profile and the charge final I-V profile, respectively.

Figure 5:
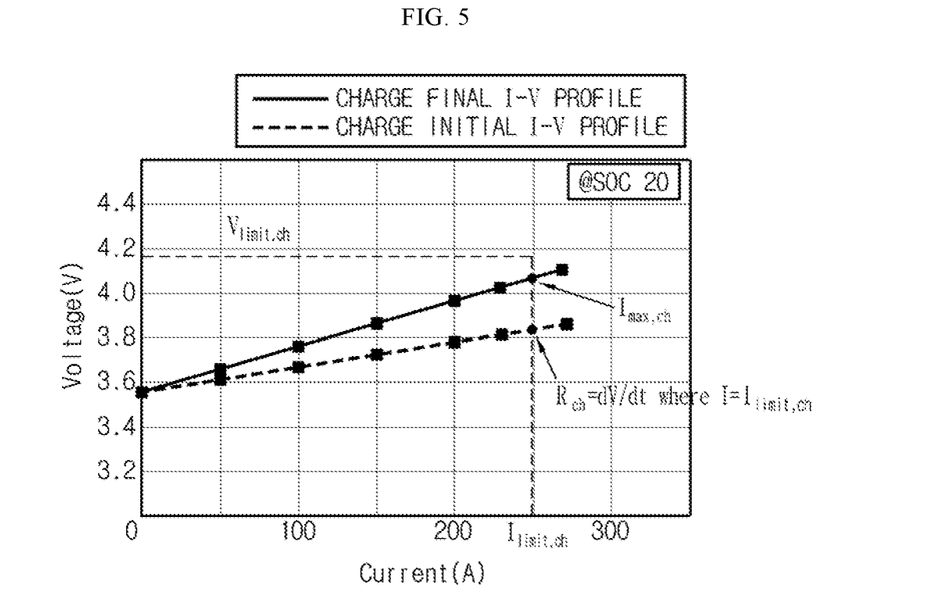
FIG. 5 illustrates graphs representing results of plotting a charge initial I-V profile and a charge final I-V profile using charge initial voltage data and charge final voltage data obtained from charge tests conducted based on the charge test algorithm of FIG. 4 when the state of charge of a lithium secondary battery is 20%, the lithium secondary battery including lithium metal oxide ($LiNi_xMn_yCo_zO_2$) and graphite in its positive electrode and negative electrode, respectively.

FIG. 5 illustrates graphs representing results of plotting the charge initial I-V profile and the charge final I-V profile using the results of measuring the charge initial voltage, $V_i$, and the charge final voltage, $V_f$, while increasing the magnitude of the charging current using the charge test algorithm of FIG. 4 regarding the lithium secondary battery having a capacity of 26 Ah including lithium metal oxide ($LiNi_xMn_yCo_zO_2$) and graphite in its positive electrode and negative electrode, respectively.

In the test conducted to obtain the graphs of FIG. 5, before the charging current was applied to the lithium secondary battery, the state of charge of the lithium secondary battery was adjusted identically to 20%.

In the I-V profile exemplified in FIG. 5, the X coordinate of the location indicated by ■ represents the magnitude of the charging current, $I_{ch}$, applied to the secondary battery B, and Y coordinate represents the charge initial voltage, $V_i$, or the charge final voltage, $V_f$, when the corresponding charging current, $I_{ch}$, is applied.

In FIG. 5, the dotted line represents the charge upper limit condition, the vertical dotted line represents the charge upper limit current, $I_{limit,ch}$, and the horizontal dotted line represents the charge upper limit voltage, $V_{limit,ch}$.

As illustrated, the charge initial I-V profile and the charge final I-V profile have an identical Y intercept. For reference, the Y intercept is the open circuit voltage measured when the charging current, $I_{ch}$, is not applied to the secondary battery B. The open circuit voltage is determined to be a unique value depending on the state of charge of the secondary battery B.

Since the charge initial I-V profile (dotted line) represents results of plotting the voltage measured right after the charging current, $I_{ch}$, was applied to the secondary battery B, for example, after 0.1 second according to the magnitude of the charging current, $I_{ch}$, and thus is located below the charge final I-V profile.

That is because, when the charging current, $I_{ch}$, is applied to the secondary battery B, the voltage gradually increases until the flow of the charging current, $I_{ch}$, stops, and thus the later the voltage is measured, the higher the voltage as measured is.

Meanwhile, the current magnitude at the point of intersection where the charge final I-V profile (solid line) meets the charge upper limit condition, corresponds to the maximum charging current, $I_{max,ch}$, that can be applied to the secondary battery B, and this current value may be determined to be a unique value according to the state of charge of the secondary battery B.

Referring to FIG. 5, it is seen that the maximum charging current, $I_{max,ch}$, that can be applied to the lithium secondary battery having a 20% state of charge is identical to the charge upper limit current, $I_{limit,ch}$, set as a boundary condition.

Figure 6:
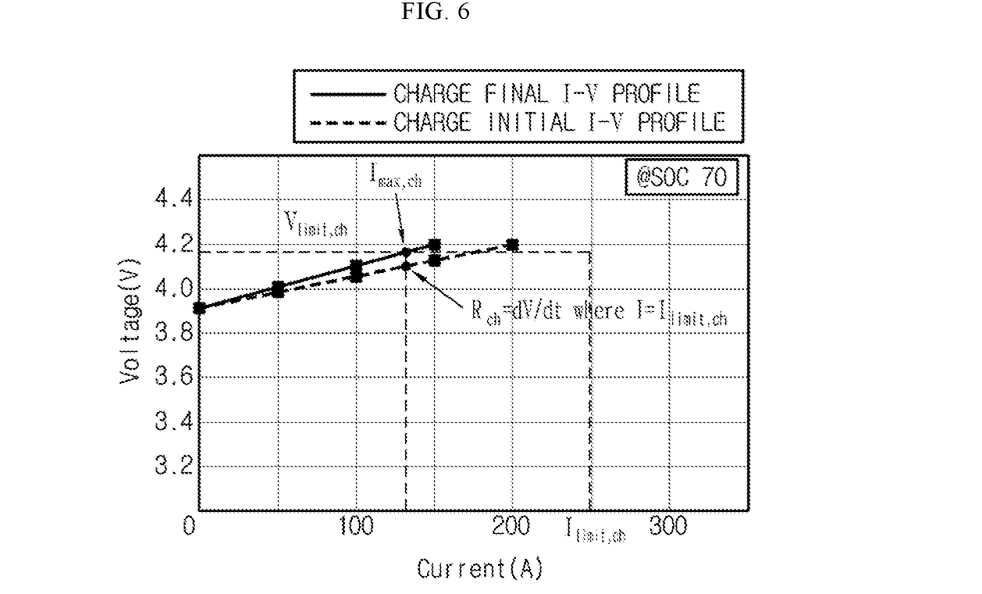
FIG. 6 illustrates graphs representing results of plotting the charge initial I-V profile and the charge final I-V profile using the charge initial voltage data and the charge final voltage data obtained from charge tests conducted based on the charge test algorithm of FIG. 4 when the state of charge of the aforementioned lithium secondary battery is 70%.

FIG. 6 illustrates graphs representing results of plotting the charge initial I-V profile and the charge final I-V profile using the charge initial voltage data and the charge final voltage data obtained from charge tests conducted based on the algorithm exemplified in FIG. 4 when the state of charge of the aforementioned lithium secondary battery is 70%.

In FIG. 6, the current magnitude at the point of intersection where the charge final I-V profile (solid line) meets the charge upper limit condition, that is, the maximum charging current, $I_{max,ch}$, applicable to the secondary battery B having a 70% state of charge is smaller than the current upper limit current, $I_{limit,ch}$, set as the charge upper limit condition. That is because the point of intersection at which the charge final I-V profile (solid line) meets the charge upper limit condition is on a straight line, $V=V_{limit,ch}$.

Figure 7:
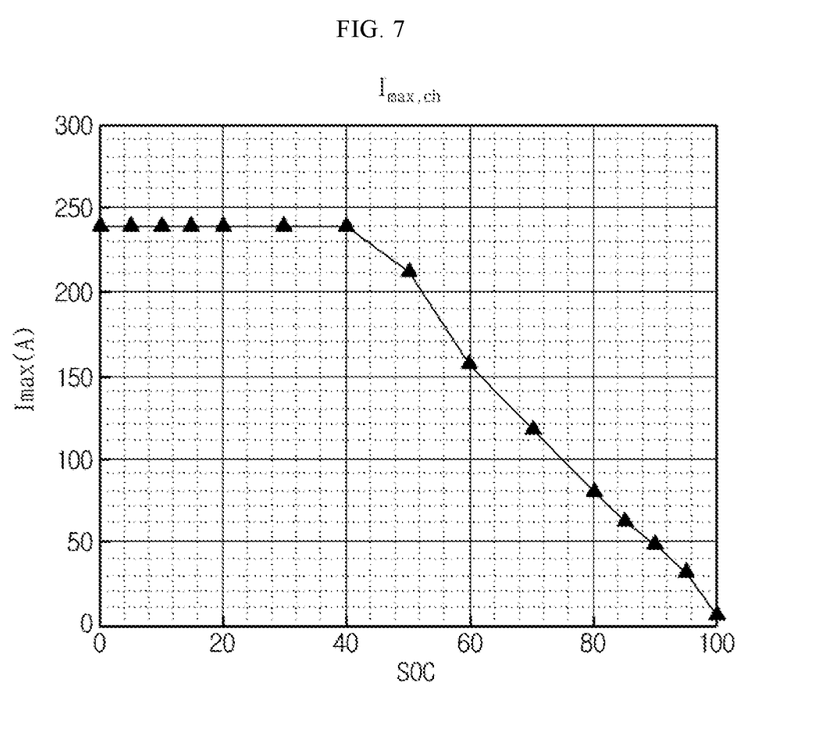
FIG. 7 illustrates graphs representing results of plotting the changing pattern of the maximum charging current, $I_{max,ch}$, obtained using the points of intersection where the charge final I-V profile corresponding to each state of charge of the lithium secondary battery changing from 0% to 100% meets the charge upper limit condition.

FIG. 7 illustrates graphs representing results of plotting the changing pattern of the maximum charging current, $I_{max,ch}$, obtained using the points of intersection where the charge final I-V profile corresponding to each state of charge of the aforementioned lithium secondary battery, changing from 0% to 100%, meets the charge upper limit condition.

As illustrated, it is seen that the maximum charging current, $I_{max,ch}$, applicable to the secondary battery B is constant in a section where the lithium secondary battery has a low state of charge, but when the state of charge increases to or above 40%, the maximum charging current, $I_{max,ch}$, applicable to the secondary battery B gradually decreases.

The reason why such a graph as FIG. 7 is obtained is because at a state of charge section where the maximum charging current, $I_{max,ch}$, is constant, the charge final I-V profile intersects the straight line, $I=I_{limit,ch}$, corresponding to the vertical line of the charge upper limit condition, and at a state of charge section where the maximum charging current, $I_{max,ch}$, gradually decreases, the charge final I-V profile intersects the straight line, $V=V_{limit,ch}$, corresponding to the horizontal line of the charge upper limit condition.

Going back to FIG. 3, the resistance factor determining program 60 according to the present disclosure may determine a resistance factor, $R_{ch@SOC}$, per state of charge of the secondary battery B using the charge initial voltage data and the charge final voltage data stored in the memory 50 per state of charge of the secondary battery B.

Further, the resistance factor determining program 60 may store the resistance factor information per state of charge in the memory 50 in the form of a look-up table such that the resistance factor, $R_{ch@SOC}$, may be mapped by the state of charge of the secondary battery B. Hereinafter, the look-up table is defined as a resistance factor look-up table.

Specifically, the resistance factor determining program 60 determines the charge final I-V profile (solid line graphs in FIG. 5 and FIG. 6) from the charge final voltage data stored in the memory 50 per state of charge (S160).

Then, the resistance factor determining program 60 calculates the X coordinate of the point where each charge final I-V profile determined at step S160 intersects the charge upper limit condition (horizontal dotted line or vertical dotted line of FIG. 5 and FIG. 6), and determines the maximum charging current, $I_{max,ch}$, of the secondary battery B per state of charge of the secondary battery B (S170).

Then, the resistance factor determining program 60 determines the charge initial I-V profile (dotted line graphs of FIG. 5 and FIG. 6) corresponding to each state of charge from the charge initial voltage data stored in the memory 50 per state of charge (S180).

Then, per each state of charge, the resistance factor determining program 60 may calculate a primary differential value, $dV/dI_{@Imax,ch}$, of the charge initial I-V profile determined at step S180 based on the maximum charging current, $I_{max,ch}$, determined at step S170, and determine the result of calculation as the resistance factor, $R_{ch@SOC}$, of the secondary battery B (S190).

In the graph exemplified in FIG. 5, the resistance factor, $R_{ch@20\%}$, when the state of charge of the lithium secondary battery is 20% corresponds to the primary differential value, dV/dI, regarding the dotted line profile calculated when the charging current was $I_{limit,ch}$.

Similarly, in the graph exemplified in FIG. 6, the resistance factor, $R_{ch@70\%}$, when the state of charge of the lithium secondary battery is 70% corresponds to the primary differential value, dV/dI, regarding the dotted line profile calculated when the charging current was $I_{max,ch}$.

Next, the resistance factor determining program 60 may store the resistance factor, $R_{ch@soc}$, determined per state of charge of the secondary battery B in the resistance factor look-up table defined in the memory 50 (S200).

Preferably, the resistance factor look-up table has a data structure where the resistance factor, $R_{ch@soc}$, of the secondary battery B may be mapped by the state of charge of the secondary battery B.

Meanwhile, the resistance factor determining system 10 according to the present disclosure may further include, as illustrated in FIG. 2, a temperature adjusting device 70 that maintains the temperature of the secondary battery B constant while the charge test is performed per state of charge of the secondary battery.

In this case, the resistance factor determining program 60 may maintain the temperature of the secondary battery B constant at a value set by the system operator by controlling the temperature adjusting device 70 when conducting the charge test according to the algorithm illustrated in FIG. 4.

Preferably, the temperature adjusting device 70 may be connected to the computing device 30, and may include an air cooling fan for lowering the temperature of the secondary battery B, a heater that increases the temperature of the secondary battery B, a temperature sensor that measures the temperature of the secondary battery B, and a controller that is provided with a temperature setting value from the resistance factor determining program 60 and that measures the temperature of the secondary battery B using the temperature sensor and controls the air cooling fan or the heater to control the temperature of the secondary battery B to be the temperature setting value. Further, the temperature adjusting device 70 may measure the temperature of the secondary battery B using the temperature sensor at a request by the resistance factor determining program 60 and provide the measured temperature value to the computing device 30.

Further, the resistance factor determining program 60 may repeatedly perform the steps disclosed in FIG. 4 for a plurality of temperature conditions, and may also determine the resistance factor, $R_{ch@SOC}$, of the secondary battery corresponding to each state of charge according to the temperature of the secondary battery B.

Specifically, the resistance factor determining program 60 may measure the charge initial voltage data and the charge final voltage data per state of charge of the secondary battery and store the same in the memory 50 while using the temperature adjusting device 70 to maintain the temperature of the secondary battery B constant under the conditions set by the system operator, and by repeating this process for the plurality of temperature conditions set by the system operator, it is possible to measure the charge initial voltage data and the charge final voltage data per state of charge according to the plurality of temperature conditions of the secondary battery, and store the same in the memory 50.

Further, the resistance factor determining program 60 may determine the resistance factor, $R_{ch@SOC}$, corresponding to the state of charge of the secondary battery B per temperature using the charge initial voltage data and the charge final voltage data stored in the memory 50.

Further, the resistance factor determining program 60 may define the resistance factor look-up table per temperature in the memory 50, and store the resistance factor, $R_{ch@SOC}$, per state of charge determined according to the temperature condition in the resistance factor look-up table defined per temperature.

The plurality of temperature values for which the resistance factor, $R_{ch@SOC}$, is to be determined may be pre-set by the system operator. For this purpose, the charging condition setting interface provided by the resistance factor determining program 60 may further include a graphic user interface (GUI) for the system operator to set the plurality of temperature values. Further, the resistance factor determining program 60 may store the plurality of temperature values set by the system operator in the memory 50.

The resistance factor, $R_{ch@SOC}$, of the secondary battery B explained so far may be used to estimate the charge power of the secondary battery B in real time.

Figure 8:
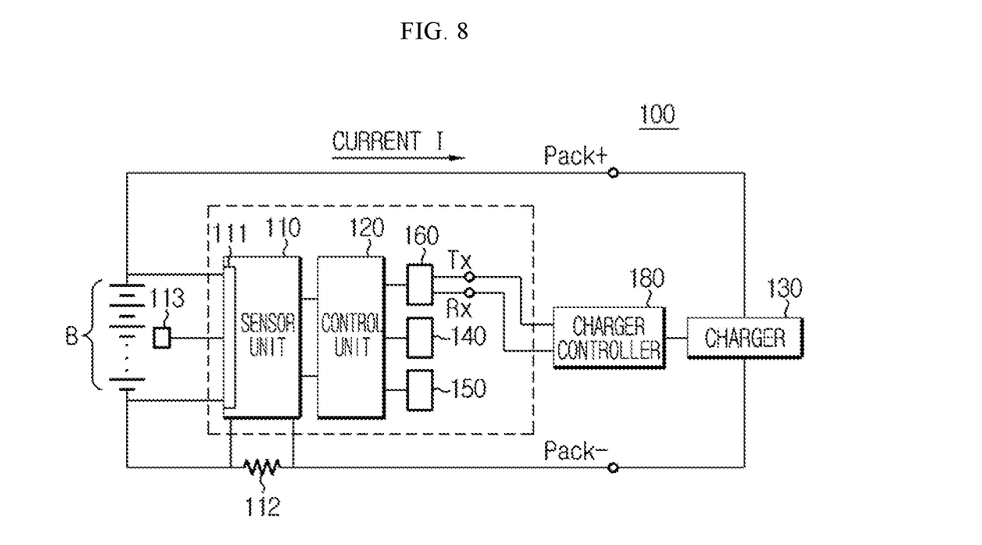
FIG. 8 schematically illustrates the configuration of a charge power estimating apparatus of a secondary battery according to an embodiment of the present disclosure.

FIG. 8 is a block diagram schematically illustrating the configuration of the charge power estimating apparatus 100 of the secondary battery according to an embodiment of the present disclosure.

Referring to FIG. 8, the charge power estimating apparatus 100 may include a sensor unit 110 and a control unit 120, and may be electrically connected with the secondary battery B to estimate the charge power of the secondary battery B while the secondary battery B is being charged.

The secondary battery B is electrically connected with a charger 130. The charger 130 is included in the device where the secondary battery B is mounted; for example, it may be a charging unit included in an electric vehicle or a hybrid vehicle.

Preferably, the charger may supply a reproduced charging current being generated when the electric vehicle or the hybrid vehicle reduces speed to the secondary battery B side under control of a charger controller 180 that will be explained hereinafter.

Preferably, the charge power estimating apparatus 100 may include a storage unit 140. The storage unit 140 is not limited to any specific type as long as it is a storage medium that can record and erase information.

For example, the storage unit 140 may be a RAM, a ROM or a register, but there is no limitation thereto in the present disclosure.

Preferably, the storage unit 140 may be connected with the control unit 120 through, for example, a data bus such that it is approachable by the control unit 120.

The storage unit 140 also stores and/or updates and/or erases and/or transmits a program that includes various control logics to be performed by the control unit 120, and/or data being generated when the control logic is executed.

The storage unit 140 may be divided logically into two or more parts, and there is no limitation for the storage unit 140 to be included in the control unit 120.

Preferably, the storage unit 140 stores therein the resistance factor look-up table that defines the resistance factor, $R_{ch@SOC}$, per state of charge of the secondary battery B.

In a more preferable example, the resistance factor look-up table may be defined per temperature of the secondary battery B. In this case, the resistance factor, $R_{ch@SOC}$, may be mapped by the temperature and the state of charge of the secondary battery B.

The resistance factor look-up table is pre-defined using the algorithm explained with reference to FIG. 3 and FIG. 4. The method for generating the resistance factor look-up table through experiments was already aforementioned. Further, when storing the resistance factor look-up table generated through the test in the storage unit 140, a general data copy technology may be used.

The sensor unit 110 is electrically combined with the control unit 120 to send and receive electrical signals with the control unit 120.

Under the control of the control unit 120, and at time intervals, the sensor unit 110 repeatedly measures the voltage being applied between the positive electrode and negative electrode of the secondary battery B, the current input into the secondary battery B or output from the secondary battery B and the temperature of the secondary battery B, and provides the measured voltage, current and temperature to the control unit 120. In this case, the voltage, current, and temperature may be measured at the same time point or at different time points.

The sensor unit 110 may include a voltage measurer for measuring the voltage of the secondary battery B, a current measurer for measuring the current of the secondary battery B, and a temperature measurer for measuring the temperature of the secondary battery B.

In an example, the voltage measurer may include a general voltage measuring circuit 111 that can measure the voltage of the secondary battery B with reference to ground (GND). Further, the current measurer may include a sense resistor 112 for measuring the magnitude of the current. Further, the temperature measurer may include a thermocouple 113 for measuring the temperature of the secondary battery.

The control unit 120 may receive the measurement results of the voltage, current and temperature of the secondary battery B from the sensor unit 110, and estimate the state of charge of the secondary battery B.

In an example, the control unit 120 may estimate the state of charge of the secondary battery B by the Ampere Counting. That is, the control unit 120 may estimate the state of charge of the secondary battery B by integrating the current measured by the sensor unit 110 with respect to time.

In order to estimate the state of charge of the secondary battery B in Ampere Counting, an initial value of the stage of charge is necessary. The initial value of the state of charge may be determined by measuring the open circuit voltage of the secondary battery B.

That is, the control unit 120 may control the sensor unit 110 before the operations of the secondary battery B are initiated to measure the open circuit voltage and the temperature, and determine the state of charge corresponding to the measured open circuit voltage and temperature as the initial value with reference to the OCV-SOC look-up table stored in the storage unit 140. The OCV-SOC look-up table has a data structure where the state of charge may be mapped by the open circuit voltage and the temperature.

In another example, the control unit 120 may estimate the state of charge of the secondary battery B using an Extended Kalman Filter. In this case, the voltage, current and temperature measured by the sensor unit 110 may be used. The technique to estimate the state of charge with the Extended Kalman Filter is well-known in the art. For example, technologies disclosed in U.S. Pat. No. 7,446,504, U.S. Pat. No. 7,589,532 and the like may be utilized, and may be combined as part of the present disclosure.

The control unit 120 may estimate the charge power using the resistance factor look-up table stored in the storage unit 140 while the secondary battery B is being charged.

That is, the control unit 120 may identify the resistance factor look-up table corresponding to the measured temperature of the secondary battery B, determine the resistance factor, $R_{ch@SOC}$, corresponding to the state of charge estimated from the identified resistance factor look-up table, and estimate the charge power of the secondary battery B by Equation 3 below using the determined resistance factor, $R_{ch@SOC}$, and the measured current of the secondary battery B.

$$P_{ch} = R_{ch@SOC} \times I^2 \qquad \text{<Equation 3>}$$

In the equation above, $P^{ch}$ is the charge power of the secondary battery B, $R_{ch@SOC}$ is the resistance factor corresponding to the temperature and state of charge of the secondary battery B, and I is the measured current of the secondary battery B, corresponding to the magnitude of the charge current.

The charge power calculated by Equation 3 has an advantage of little error as it is calculated by using current which is easy to measure. Further, during charging of the secondary battery B, it is difficult to measure the exact voltage due to internal resistance and polarization voltage of the secondary battery B. Therefore, it is more preferred to calculate the charge power using current.

The charge power calculated by Equation 3 is determined using the resistance factor, $R_{ch@SOC}$, pre-determined using the voltage response characteristics that occur at early stages of charging when the charging current measured by the sensor unit 110 is applied to the secondary battery B.

Therefore, when charging of the secondary battery B is controlled on the basis of the charge power, the voltage or charge current of the secondary battery B may be prevented from deviating from the charge upper limit condition.

That is, since the secondary battery B may be prevented from being applied with excessive charging current or being charged to an overvoltage state, a safer charge control is possible.

The control unit 120 may store the estimated charge power of the secondary battery B and the historic variations of the charge power in the storage unit 140.

In another aspect, the charge power estimating apparatus 100 may further include a display unit 150. The display unit 150 is not limited to any specific type, as long as it can display charge power estimated at the control unit 120 as graphic user interface (GUI) such as numbers, texts, graphics, and the like.

In one example, the display unit 150 may be a liquid crystal display, LED display, OLED display, E-INK display, flexible display, and so on.

The display unit 150 may be connected to the control unit 120 either directly or indirectly. In the latter case, the display 150 may be located in an area that is physically separated from the area where the control unit 120 is located. Further, a third-party control unit may be disposed between the display unit 150 and the control unit 120 such that the third-party control unit may receive from the control unit 120 information to be expressed on the display unit 150 and express the received information through the display unit 150. To this purpose, the third-party control unit and the control unit 120 may be connected for transmission and reception of data.

In another aspect, the charge power estimating apparatus 100 may further include a communication interface 160. The communication interface 160 supports transmission and reception of data between the control unit 120 and a charger controller 180 for controlling the operations of the charger 130.

In such example, the control unit 120 may transmit the estimated charge power of the secondary battery B to the charger controller 180. Then, the charger controller 180 can control the charging operations of the secondary battery B using the charge power of the secondary battery B within the charge upper limit condition with a certain extent of safety margin.

In order to implement a variety of control logics including those described above, the control unit 120 may optionally include processor, application-specific integrated circuit (ASIC), other chipsets, logic circuit, register, communication modem, data processor, and so on, as known in the art. Further, when the control logic is implemented as software, the control unit 120 may be implemented as a set of program modules. In this case, the program modules may be stored at a memory and executed by the processor. The memory may be internal or external to the processor and may be connected with the processor with a variety of known computer components. Further, the memory may be included in the storage unit 140 of the present disclosure. Further, the 'memory' collectively refers to any type of devices where information is stored, and is not intended to refer to any specific memory device.

It is apparent that the aforementioned control logics of the control unit 120 may construct process of a method for estimating charge power of the secondary battery according to embodiments of the present disclosure.

Figure 9:
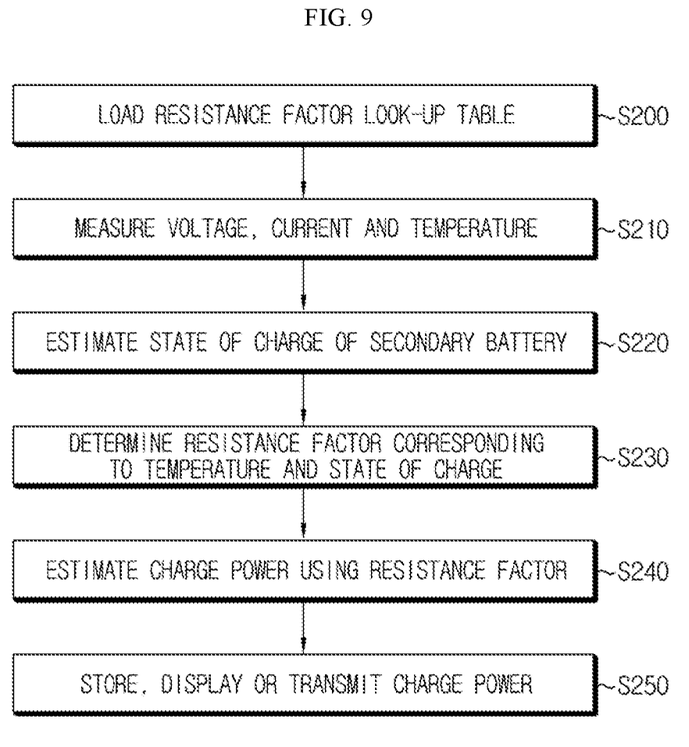
FIG. 9 is a flowchart illustrating a charge power estimating method of a secondary battery according to an embodiment of the present disclosure.

FIG. 9 is a flowchart illustrating a sequential flow of a charge power estimating method of a secondary battery according to an embodiment of the present disclosure.

First, at step S200, the control unit 120 loads the resistance factor look-up table from the storage unit 140. The resistance factor look-up table defines the resistance factor, $R_{ch@SOC}$, of the secondary battery per state of charge. Preferably, the resistance factor look-up table may be separately defined according to temperature conditions.

Next, the control unit 120 measures the voltage, current and temperature of the secondary battery through the sensor unit 110 at step S210, stores the measured results in the storage unit 140, and estimates the state of charge of the secondary battery at step S220.

Next, at step S230, the control unit 120 identifies the resistance look-up factor table corresponding to the measured temperature, and determines the resistance factor, $R_{ch@SOC}$, corresponding to the estimated state of charge by using the identified resistance factor look-up table.

Next, the control unit 120 estimates the charge power, $P^{ch}$, of the secondary battery using the resistance factor, $R_{ch@soc}$, determined using the aforementioned Equation 3 and the measured charging current, I.

Optionally, the control unit 120 may store the estimated charge power in the storage unit 140 at step S250, or display it through the display unit 150, or externally transmit it through the communication interface 160.

At least one of various control logics of the control unit 120 may be combined, and the combined control logics may be written as a computer-readable code system and recorded on a computer-readable recording medium. The recording medium is not limited to any specific type, as long as it is accessible by a processor included in the computer. In one example, the recording medium may include at least one selected from the group consisting of ROM, RAM, register, CD-ROM, magnetic tape, hard disk, floppy disk, and optical data recording device. Further, the code system may be distributed to computers connected via network, and then stored and executed. Further, programmers in the technical field pertinent to the present disclosure will be easily able to envision functional programs, codes and code segments to implement the combined control logics.

In describing a variety of aspects of the present disclosure, the elements with names ending with 'unit' will have to be understood as the elements that are distinguished functionally, rather than being distinguished physically. Accordingly, the respective elements may be optionally incorporated with another element, or each of the elements may be divided into sub-elements such that the respective elements efficiently implement control logic(s). However, even when the elements are incorporated or divided, it will be obvious to those skilled in the art that the incorporated or divided elements also fall under the scope of the present disclosure, as long as the sameness of functions is acknowledged.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

According to an aspect of the present disclosure, a resistance factor to be utilized in estimating a charge power of a secondary battery within a safety margin can be easily determined.

According to another aspect of the present disclosure, a charge power of a 15 secondary battery can be estimated reliably with a safety margin from charge upper limit conditions of the secondary battery.

According to another aspect of the present disclosure, the voltage or charging current of a secondary battery can be prevented from increasing excessively in the process of controlling the charge of the secondary battery.

What is claimed is:

1. A resistance factor determining method of a secondary battery, the method comprising:
    (a) measuring charge initial voltage data and charge final voltage data according to changes in magnitude of a charging current per temperature and state of charge of the secondary battery, and storing the charge initial voltage data and the charge final voltage data in a memory;
    (b) determining a charge final current-voltage (I-V) profile from the final voltage data, and determining a point of intersection at which the charge final I-V profile meets a boundary line corresponding to a charge upper limit current or a charge upper limit voltage pre-set to a charge upper limit condition;
    (c) determining a charge initial I-V profile from charge initial voltage data, and determining a primary differential value regarding the charge initial I-V profile calculated based on a current value of the point of intersection; and
    (d) designating the determined primary differential value as a resistance factor corresponding to a temperature and state of charge of the secondary battery,
    wherein the charge initial voltage data is voltage data measured at a time point within 1 second after the charging current was applied to the secondary battery, and wherein the charge final voltage data is voltage data measured at a time point when applying of the charging current to the secondary battery ended.

2. The method of claim 1, further comprising defining a resistance factor look-up table in the memory such that the resistance factor of the secondary battery may be mapped by the temperature and state of charge of the secondary battery; and storing the determined resistance factor in the defined resistance factor look-up table.

3. The method of claim 1, wherein step (a) comprises:
maintaining the temperature of the secondary battery constant;
proceeding a charge test of applying a plurality of charging currents having different magnitudes to the secondary battery per state of charge of the secondary battery; and
measuring and storing the charge initial voltage and the charge final voltage of the secondary battery every time each charging current is applied.

4. The method of claim 3, wherein the charge test is paused when a magnitude of the charging current applied to the secondary battery is greater than the charge upper limit current or when a latest measured charge final voltage of the secondary battery is greater than the charge upper limit voltage.

5. A charge power estimating apparatus of a secondary battery comprising:
a storage unit where a resistance factor look-up table for referencing a resistance factor by a temperature and state of charge of the secondary battery is pre-stored, wherein the resistance factor is determined by the method of claim 1;
a sensor unit that measures a charging current and temperature of the secondary battery while the secondary battery is being charged; and
a control unit that determines the state of charge of the secondary battery, determines the resistance factor corresponding to the determined state of charge and the measured temperature with reference to the resistance factor look-up table, and estimates the charge power of the secondary battery from the determined resistance factor and the measured charging current,
wherein, when the secondary battery has a certain temperature and state of charge, the resistance factor is a primary differential value regarding a charge initial I-V profile calculated from a current value of a point of intersection at which a charge final I-V profile according to changes in magnitude of the charging current meets a boundary line set to a charge upper limit.

6. The apparatus of claim 5, wherein the boundary line is a boundary line that indicates a charge upper limit current and a charge upper limit voltage.

7. The apparatus of claim 5, wherein the charge initial I-V profile is a graph that defines a correlation between the charging current applied to the secondary battery and a voltage measured right after the corresponding charging current is applied when a plurality of charging currents having different magnitudes are applied to the secondary battery.

8. The apparatus of claim 7, wherein voltage data constructing the charge initial I-V profile is voltage data measured within 1 second after each charging current was applied to the secondary battery.

9. The apparatus of claim 5, wherein the charge final I-V profile is a graph that defines a correlation between the charging current applied to the secondary battery and a voltage measured at a time point when the applying of the corresponding charging current ended when a plurality of charging currents having different magnitudes are applied to the secondary battery.

10. The apparatus of claim 5, wherein the control unit is configured to store the estimated charge power in the storage unit.

11. The apparatus of claim 5, further comprising a display unit connected with the control unit, wherein the control unit displays the estimated charge power through the display unit.

12. The apparatus of claim 5, further comprising a communication interface connected with the control unit,
wherein the control unit externally transmits the estimated charge power through the communication interface.

13. A charge power estimating method of a secondary battery, the method comprising:
providing a resistance factor look-up table for referencing a resistance factor by a temperature and state of charge of the secondary battery, wherein the resistance factor is determined by the method of claim 1;
measuring a charging current and the temperature of the secondary battery while the secondary battery is being charged;
determining the state of charge of the secondary battery;
determining the resistance factor corresponding to the deteiinined state of charge and the measured temperature with reference to the resistance factor look-up table; and
estimating a charge power of the secondary battery from the determined resistance factor and the measured charging current;
wherein, when the secondary battery has a certain temperature and state of charge, the resistance factor is a primary differential value regarding a charge initial profile calculated from a current value at a point of intersection at which a charge final I-V profile according to changes in magnitude of the charging current meets a boundary line set to a charge upper limit.

14. The method of claim 13, wherein the boundary line is a boundary line that indicates a charge upper limit current and a charge upper limit voltage.

15. The method of claim 13, wherein the charge initial I-V profile is a graph that defines a correlation between the charging current applied to the secondary battery and a voltage measured right after the corresponding charging current was applied when a plurality of charging currents having different magnitudes are applied to the secondary battery.

16. The method of claim 15, wherein voltage data constructing the charge initial I-V profile is voltage data measured within 1 second after each charging current was applied to the secondary battery.

17. The method of claim 13, wherein the charge final I-V profile is a graph that defines a correlation between the charging current applied to the secondary battery and a voltage measured at a time point when the applying of the corresponding charging current ended when a plurality of charging currents having different magnitudes are applied to the secondary battery.

18. The method of claim 13, further comprising storing, displaying or transmitting the estimated charge power.

* * * * *